(12) United States Patent
Sicard et al.

(10) Patent No.: US 9,543,942 B2
(45) Date of Patent: Jan. 10, 2017

(54) METHOD AND APPARATUS FOR CONTROLLING AN IGBT DEVICE

(71) Applicants: Thierry Sicard, Toulouse (FR); Philippe Perruchoud, Tournefeuille (FR)

(72) Inventors: Thierry Sicard, Toulouse (FR); Philippe Perruchoud, Tournefeuille (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/037,473

(22) PCT Filed: Nov. 22, 2013

(86) PCT No.: PCT/IB2013/002898
§ 371 (c)(1),
(2) Date: May 18, 2016

(87) PCT Pub. No.: WO2015/075497
PCT Pub. Date: May 28, 2015

(65) Prior Publication Data
US 2016/0315608 A1  Oct. 27, 2016

(51) Int. Cl.
*H03K 5/12* (2006.01)
*H03K 17/567* (2006.01)

(52) U.S. Cl.
CPC .................................. *H03K 17/567* (2013.01)

(58) Field of Classification Search
CPC .................................. H03K 6/04; H03K 5/12
USPC .................................................. 327/108, 170
See application file for complete search history.

(56) References Cited

U.S. PATENT DOCUMENTS

| | | | |
|---|---|---|---|
| 4,170,740 A | 10/1979 | Pernyeszi | |
| 5,909,138 A | 6/1999 | Stendahl | |
| 6,271,709 B1 * | 8/2001 | Kimura | H03K 17/168 327/170 |

(Continued)

FOREIGN PATENT DOCUMENTS

| | | |
|---|---|---|
| EP | 2 242 223 A1 | 10/2010 |
| FR | 2 418 576 A1 | 9/1979 |

(Continued)

OTHER PUBLICATIONS

International Search Report for application PCT/IB2013/000315 (Jun. 20, 2013).

(Continued)

*Primary Examiner* — Kenneth B Wells
(74) *Attorney, Agent, or Firm* — Charlene R. Jacobsen

(57) ABSTRACT

The present invention comprises a method and apparatus for controlling an IGBT device. The method comprises, upon receipt of a first and at least one further IGBT control signals, the first IGBT control signal indicating a required change in operating state of the IGBT device, controlling an IGBT driver module for the IGBT device to change an operating state of the IGBT device by applying a first logical state modulation at an input of an IGBT coupling channel, and applying at least one further modulation to the logical state at the input of the IGBT coupling channel in accordance with the at least one further IGBT control signal within a time period from the first logical state modulation, the time period being less than a state change reaction period Δt for the at least one IGBT device.

19 Claims, 8 Drawing Sheets

(56) References Cited

U.S. PATENT DOCUMENTS

| | | |
|---|---|---|
| 7,741,896 B2 | 6/2010 | Chow et al. |
| 8,198,951 B2 | 6/2012 | Dong et al. |
| 8,994,413 B2 * | 3/2015 | Kanschat ............... H03K 17/00 326/83 |
| 2002/0172351 A1 | 11/2002 | Beutler et al. |
| 2004/0212415 A1 | 10/2004 | Sutherland et al. |
| 2011/0031979 A1 | 2/2011 | Gillberg et al. |
| 2012/0047300 A1 | 2/2012 | Bulteau |
| 2012/0161852 A1 | 6/2012 | Curbelo et al. |
| 2013/0106469 A1 | 5/2013 | Slavov et al. |
| 2013/0107584 A1 | 5/2013 | Li et al. |
| 2013/0293287 A1 | 11/2013 | Zhu |
| 2014/0028369 A1 | 1/2014 | Fang et al. |

FOREIGN PATENT DOCUMENTS

| | | |
|---|---|---|
| GB | 2 280 320 A1 | 1/1995 |
| WO | WO-2004/090737 A2 | 10/2004 |
| WO | WO-2013/102778 A1 | 7/2013 |
| WO | WO-2014/057318 A1 | 4/2014 |

OTHER PUBLICATIONS

International Search Report for application PCT/IB2013/002898 (Aug. 21, 2014).

Von Daak, Matthias et al; "Isolated capacitively coupled MOS driver circuit with bidirectional signal transfer"; IEEE Power Electronics Specialists Conference, Fukuoka, JP; pp. 1208-1213 vol. 2 (May 17-22, 1998).

* cited by examiner

METHOD AND APPARATUS FOR CONTROLLING AN IGBT DEVICE

FIELD OF THE INVENTION

This invention relates to a method and apparatus for controlling an IGBT device, and in particular to a method and apparatus for controlling an IGBT device to implement a dual slew rate.

BACKGROUND OF THE INVENTION

In the field of high voltage electronic devices, it is known to implement high voltage (e.g. ~1500V) isolation between a low voltage (e.g. ~5V) control integrated circuit (IC) device and a high voltage output driver module. Such isolation is required in order to avoid shorting between the high voltage output and the low voltage control circuitry.

Typically, such high voltage isolation is implemented using galvanic isolation. Galvanic isolation is a principle of isolating functional sections of electrical systems to prevent current flow; no metallic conduction path is permitted. Energy or information can still be exchanged between the sections by other means, such as capacitance, induction or electromagnetic waves, or by optical, acoustic or mechanical means.

In some applications it is desirable to implement a dual slew rate for a high voltage output driver. For example, a first (fast) turn off rate of, say, an insulated-gate bipolar transistor (IGBT) device may be required to be implemented in order to optimise the turn off energy of the IGBT device. In addition, a second (slow) turn off rate of the IGBT device may be required to be implemented in order to avoid overshoot of a load current.

Implementation of such a dual slew rate requires two kinds of information to be conveyed from the control component to the high voltage output driver module: 1) information for controlling the turning on and off of the driver device; and 2) information for controlling the slew rate (i.e. controlling whether the driver device is turned off at a fast rate or a slow rate). A conventional approach for conveying the two kinds of information from the control component to the high voltage output driver module is to use two coupling channels: a first signal for controlling the turning on and off of the driver device; a second signal controlling the slew rate. An example of such a conventional approach is illustrated and described in U.S. Pat. No. 7,741,896.

A problem with this conventional approach is that in order to maintain the isolation between the low voltage control circuitry and the high voltage driver module, isolation circuits have to be implemented for both of the two coupling channels. Such isolation circuits require a significant amount of die area, and thus the need for duplication of the isolation circuits is undesirable.

SUMMARY OF THE INVENTION

The present invention provides a control module for controlling at least one IGBT device, a method of controlling at least one IGBT device implemented within an IGBT device, an IGBT driver module, a method of controlling at least one IGBT device implemented within an IGBT driver module, and an IGBT control apparatus as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
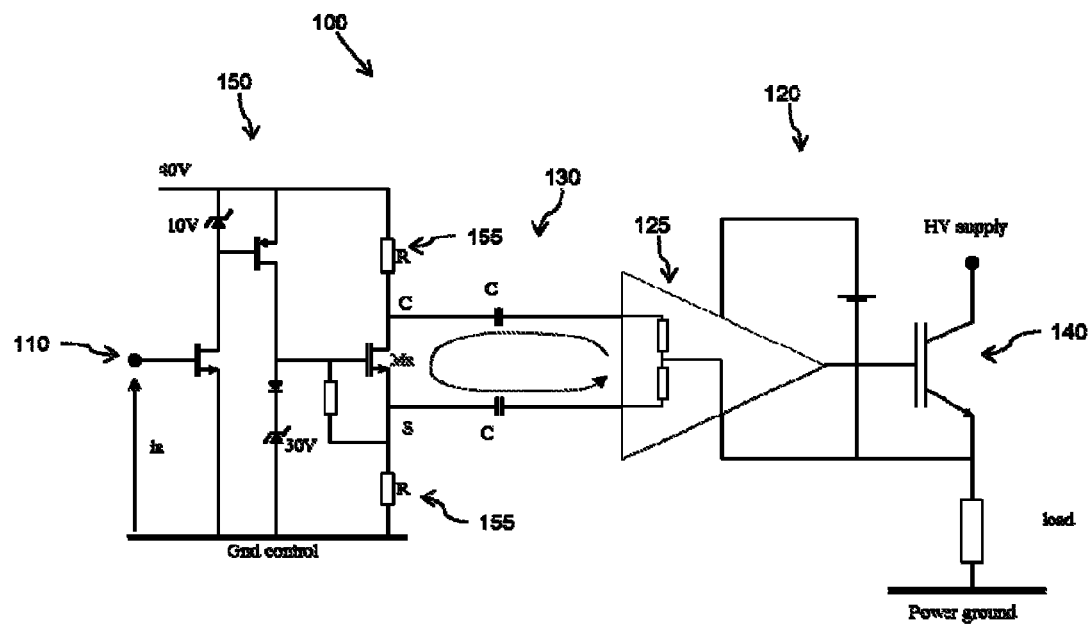
FIG. 1 illustrates a simplified circuit diagram of an example of an isolation circuit.

The present invention will now be described with reference to the accompanying drawings in which there are illustrated examples of a method and apparatus for controlling an insulated gate bipolar transistor (IGBT) device. In particular, an example of the present invention is herein described with reference to the accompanying drawings in which a coupling channel for an IGBT driver module is modulated to comprise a first IGBT control signal for controlling the IGBT driver module to turn an IGBT device off, and at least one further IGBT control signal for controlling the IGBT driver module to implement either a fast turn off (slew) rate or a slow turn off (slew) rate. However, it will be appreciated that the present invention is not limited to the specific examples herein described and as illustrated in the accompanying drawings, and the various alterations and modifications may be made without detracting from the inventive concept.

For example, it is contemplated that the present invention is not limited to modulating a coupling channel for an IGBT driver module to comprise a first indication for controlling the IGBT driver module to turn an IGBT device off, and a further indication for controlling the IGBT driver module to implement either a fast turn off rate or a slow turn off rate. In particular, it is contemplated that the present invention may equally be implemented in relation to any control signal for an IGBT driver module whereby a coupling channel is modulated to comprise a first control signal for controlling the IGBT driver module to turn one or more IGBT devices on or off, and at least one further control signal for controlling at least one further functionality of the IGBT driver module. In some examples, it is contemplated that the at least one further functionality of the IGBT driver module may be related to the indicated turning on/off of the IGBT device, for example such as the slew rate with which the IGBT device is to be turned on/off, the duration for which the IGBT device is to be turned on/off (e.g. until a control signal indicating the operating state of the IGBT device is to be changed, or for a predefined period of time).

Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

In accordance with some examples of a first aspect of the present invention, there is provided a control module for controlling at least one IGBT device. The control module comprises at least one output arranged to be operably coupled to at least one IGBT driver module for the at least one IGBT device. The control module is arranged to receive a first IGBT control signal indicating a required operating state of the at least one IGBT device and at least one further IGBT control signal. The control module is further arranged to, upon the first IGBT control signal indicating a required change in operating state of the at least one IGBT device:

(i) control the at least one IGBT driver module to change an operating state of the at least one IGBT device by applying a first logical state modulation at the output thereof; and (ii) apply at least one further modulation to the logical state at the output thereof in accordance with the at least one further IGBT control signal within a time period from the first logical state transition, the time period being less than a state change reaction period Δt for the at least one IGBT device.

In this manner, and as described in greater detail below, multiple control signal are able to be sequentially conveyed to an IGBT driver module for controlling an IGBT device using only a single IGBT coupling channel.

In some examples, the first logical state modulation may comprise a logical state transition at the output of the control module.

In some examples, applying the at least one further modulation to the logical state at the output of the control module may comprise:
 causing at least one logical state transition at the output of the control module within the time period from the first logical state modulation, in accordance with a first condition of the at least one further IGBT control signal; and
 causing no further logical state transitions at the output of the control module within the time period from the first logical state modulation, in accordance with a second condition of the at least one further IGBT control signal.

In some examples, applying the at least one further modulation to the logical state at the output of the control module may further comprise, in accordance with the first condition of the at least one further IGBT control signal, causing at least one still further logical state transition at the output thereof such that the logical state of the output of the control module is returned to the logical state following the first logical state modulation.

In some examples, the at least one further IGBT control signal may comprise an IGBT operating state change slew rate control signal.

In accordance with some examples of a second aspect of the present invention, there is provided a method of controlling an IGBT device. The method of this second aspect of the invention comprising receiving a first IGBT control signal indicating a required operating state of the IGBT device and receiving at least one further IGBT control signal. The method further comprises, upon the first IGBT control signal indicating a required change in operating state of the IGBT device:

(i) controlling an IGBT driver module for the IGBT device to change an operating state of the IGBT device by applying a first logical state modulation at an input of an IGBT coupling channel; and (ii) applying at least one further modulation to the logical state at the input of the IGBT coupling channel in accordance with the at least one further IGBT control signal within a time period from the first logical state modulation, the time period being less than a state change reaction period Δt for the at least one IGBT device.

In accordance with some examples of a third aspect of the present invention, there is provided an IGBT driver module comprising at least one decoder; the at least one decoder comprising an input arranged to be operably coupled to an output of at least one IGBT control module and arranged to:
 detect a first logical state modulation at the input thereof, and output a first IGBT control signal indicating a required change of operating state of at least one IGBT device upon detection of a first logical state modulation at the input thereof; and
 detect at least one further modulation of the logical state at the input thereof within a time period from the first logical state modulation, the time period being less than a state change reaction period Δt for the at least one IGBT device, and output at least one further IGBT control signal in accordance with the detected at least one further modulation of the logical state at the input thereof.

In some examples, the at least one decoder may be arranged to detect logical state modulations at the input thereof comprising logical state pulses.

In some examples, the at least one decoder may be arranged to detect at least one further modulation of the logical state at the input thereof comprising:
 at least one pulse at the input thereof within the time period from the first logical state modulation, in accordance with a first condition of the at least one further IGBT control signal; and
 no further logical state modulations at the input thereof within the time period from the first logical state transition, in accordance with a second condition of the at least one further IGBT control signal.

In some examples, the at least one decoder may comprise a first decoding component comprising an input arranged to be operably coupled to an output of at least one IGBT control module, the first decoding component being arranged to detect a first logical state modulation at the input thereof, and output a first IGBT control signal indicating a required change of operating state of at least one IGBT device upon detection of a first logical state modulation at the input thereof.

In some examples, the first decoding component may comprise an RS latch device comprising a set input arranged to be operably coupled to an output of at least one IGBT control module.

In some examples, the RS latch device may further comprise a reset input operably coupled to an output of the RS latch device via a delay circuit.

In some examples, the decoder may comprise at least one further decoding component comprising an input arranged to be operably coupled to an output of at least one IGBT control module, the at least one further decoding component being arranged to detect at least one further modulation of the logical state at the input thereof within a time period from the first logical state modulation, the time period being less than a state change reaction period Δt for the at least one IGBT device, and output at least one further IGBT control signal in accordance with the detected at least one further modulation of the logical state at the input thereof.

In some examples, the at least one further decoding component may comprise a divide-by-two circuit comprising at least one flip-flop device arranged to be clocked upon each second pulse of a logical state at the input of the at least one further decoding component; wherein a data input of the at least one flip-flop device is operably coupled to the output of the first decoding component, and the at least one flip-flop device is arranged to output, as at least one further IGBT control signal, the signal received at its data input upon being clocked.

In some examples, the IGBT driver module may further comprise at least one driver component arranged to receive the first and at least one further IGBT control signals output by the at least one decoder, and to control at least one IGBT device in accordance with the received first and at least one further IGBT control signals.

In some examples, the at least one driver component may be arranged to control a change of operating state of the IGBT device in accordance with the first IGBT control signal.

In some examples, the driver component may be arranged to control a slew rate with which an operating state of the IGBT device is to be changed in accordance with the at least one further IGBT control signal.

In accordance with some examples of a fourth aspect of the present invention, there is provided a further method of controlling an IGBT device. The method of this fourth aspect of the present invention comprises, within an IGBT driver module:

detecting a first logical state modulation at an input of the IGBT driver module;
deriving a first IGBT control signal indicating a required change of operating state of at least one IGBT device upon detection of a first logical state modulation at the input thereof;
detecting at least one further modulation of the logical state at the input of the IGBT driver module within a time period from the first logical state modulation, the time period being less than a state change reaction period Δt for the at least one IGBT device; and
deriving at least one further IGBT control signal in accordance with the detected at least one further modulation of the logical state at the input thereof.

In accordance with some examples of a fifth aspect of the present invention, there is provided an IGBT control apparatus comprising at least one IGBT driver module according to the fourth aspect of the present invention.

In some examples, the IGBT control apparatus may further comprise at least one IGBT control module according to the first aspect of the present invention.

Referring now to FIG. 1, there is illustrated a simplified circuit diagram of an example of an isolation circuit 100 arranged to provide electrical isolation between a control module and a high voltage driver module such as for driving an insulated gate bipolar transistor (IGBT) device. A detail description of such an isolation circuit is provided in the Applicant's co-pending international patent application number PCT/IB2013/000315.

The isolation circuit 100 illustrated in FIG. 1 is arranged to receive a control signal from a control module (not shown) operably coupled to an input 110 thereof, and to communicate the received control signal to an input of a high voltage driver module 120 via a capacitive coupling 130; the capacitive coupling 130 providing the electrical isolation between the control module (not shown) and the high voltage driver module 120. The high voltage driver module 120 is arranged to control (e.g. turn on or off) an IGBT device 140 is accordance with the received control signal. In the illustrated example, the high voltage driver module 120 comprises a differential comparator 125 arranged to receive a differential input signal via the capacitive coupling 130, and the isolation circuit 100 comprises an input stage 150 arranged to convert the received control signal into a differential signal for communication to the differential inputs of the comparator 125 via the capacitive coupling 130. The differential comparator 125 converts the received differential signal into a control signal for controlling the IGBT device 140

Conventionally, in order to implement a dual slew rate for the IGBT device for which two control signals are required to be conveyed from a control module to a high voltage driver module, two coupling channels have to be implemented, with two isolation circuits such as that illustrated in FIG. 1 have to be implemented; one for each of the coupling channels.

Figure 2:
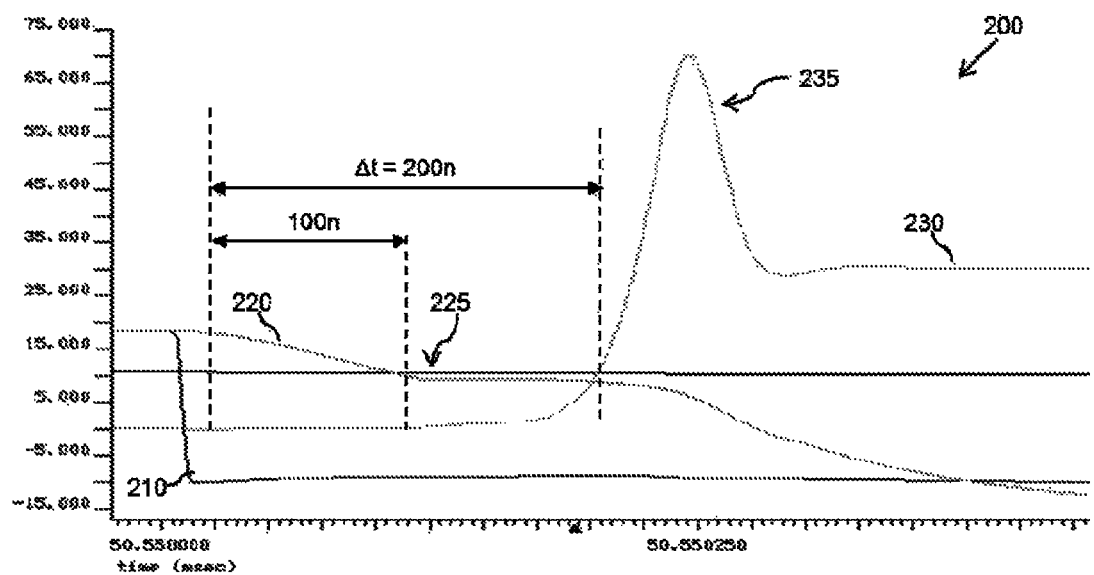
FIG. 2 illustrates a graph showing an example of the behaviour of an IGBT device.

Referring now to FIG. 2, there is illustrated a graph 200 showing an example of the behaviour of an IGBT device, such as the IGBT device 140 illustrated in FIG. 1, when being turned off (i.e. when the IGBT device is being switched from a conductive operating state to a non-conductive operating state).

A first plot 210 of the graph 200 illustrates a voltage applied to the gate of the IGBT device, such as the control signal output by the differential comparator 125 in FIG. 1. At the start of the timeframe illustrated in the graph 200, the gate voltage 210 changes from approximately 15 volts to approximately −10 volts, indicating that the IGBT device is being controlled to switch from an on state to an off state.

A second plot 220 of the graph 200 illustrates a gate-emitter voltage (Vge) for the IGBT device. As can be seen from the graph 200, the gate-emitter voltage (Vge) 220 does not change as quickly as the control signal applied to the gate of the IGBT device, due to internal resistances and capacitances of the IGBT device. The gate-emitter voltage (Vge) 220 initially starts to drop, but then the gate-emitter voltage (Vge) 220 reaches the Miller Plateau, after approximately 100 ns in the illustrated example as indicated generally at 225. The Miller Plateau relates to the gate charge curve of the IGBT device and describes an operating region where the gate-emitter voltage (Vge) of the IGBT remains substantially constant (i.e. plateaus) whilst the gate charge continues to increase/decrease. In the illustrated example, after approximately 200 ns the gate-emitter voltage (Vge) 220 begins again to drop until it eventually reaches the gate voltage 210.

A third plot 230 of the graph 200 illustrates the collector-emitter voltage (Vce) of the IGBT device. It should be noted that for this third plot 230 of graph 200, the collector-emitter voltage (Vce) value has been divided by ten to enable it to be meaningfully illustrated using the same Y-axis as the first plot 210 illustrating the voltage applied to the gate of the IGBT device and the second plot 220 illustrating the gate-emitter voltage (Vge) for the IGBT device. Thus, in the graph 200 the collector-emitter voltage (Vce) of the IGBT device has been illustrated as having a peak voltage of approximately 65V, representing an actual peak voltage of approximately 650V.

In the graph 200, an example of the collector-emitter voltage (Vce) of the IGBT device is illustrated when the IGBT device is turned off with a 'fast' slew rate. In this example, the gate voltage 210 is simply driven low to cause the IGBT device to be switched off as fast as possible. As illustrated in the graph 200, turning off the IGBT device with a fast slew rate in this manner causes a voltage overshoot of the collector-emitter voltage (Vce), as illustrated at 235. Such a voltage overshoot 235 causes a voltage spike across the IGBT device, which can be undesirable in some applications/situations. Hence, in some applications it is desirable to implement a dual slew rate for the IGBT driver module, whereby the IGBT driver module may be controlled to implement a slow slew rate when turning off the IGBT device in order to avoid the voltage overshoot 235.

As illustrated in the graph 200 illustrated in FIG. 2, the voltage across the collector-emitter voltage (Vce) of the IGBT device remains at 0v and does not start to increase (i.e. start to turn off) until towards the end of the Miller Plateau region 225, even when the IGBT device is driven to turn off with a fast slew rate. The inventors have recognised that this delay of, in the illustrated example, 200 ns between a control signal driving the gate voltage 210 low and the collector-emitter voltage (Vce) of the IGBT device increasing in response thereto may be exploited in order to enable a dual slew rate to be implemented over a single control signal in order to alleviate the need for the second isolation circuit. A corresponding delay is also present between a control signal driving the gate voltage 210 high and the collector-emitter voltage (Vce) of the IGBT device decreasing in response thereto.

Figure 3:
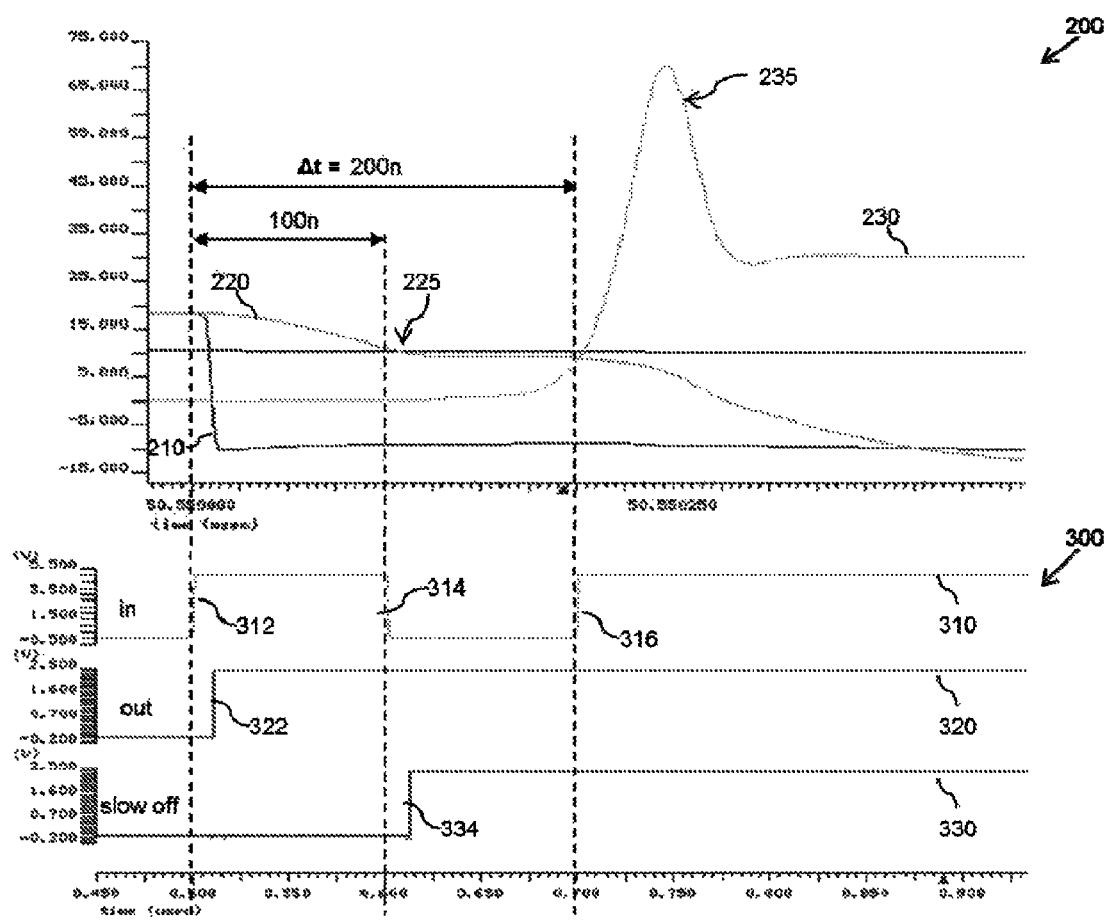
FIG. 3 illustrates an example of a control signal for communicating via an isolation circuit.

Referring now to FIG. 3, there is illustrated a reproduction of the graph of FIG. 2 along with a further graph 300 showing an example of a proposed control signal for communicating via an isolation circuit, whereby a single control signal is used to convey two kinds of information to an IGBT driver module: 1) information for controlling the turning on and off of the driver device; and 2) some other information, such as for controlling the slew rate (i.e. controlling whether the driver device is turned off at a fast rate or a slow rate). In particular, FIG. 3 illustrates an example of the modulation of the control signal to convey information for controlling the IGBT driver module to turn the IGBT device off, and information for controlling the IGBT driver module to, say, implement either a fast turn off rate or a slow turn off rate.

The graph 300 comprises a first plot 310 illustrating the control signal to be conveyed via an isolation circuit to an IGBT driver module. It is proposed that decoding logic, such as described below, within the IGBT driver module receives the control signal 310 and decodes the modulated control signal 310 to obtain two (or more) kinds of information.

In the example illustrated in FIG. 3, it is proposed to use an initial transition 312 of the control signal 310 to signal to the IGBT driver module that the IGBT device is to be turned on/off. This information may be decoded by decoding logic, which generates an IGBT gate control signal represented in the graph 300 by plot 320. As can be seen in the graph 200, the IGBT driver module drives the gate voltage 210 of the IGBT device low in response to this initial transition 322 within the gate control signal 320.

As described above, there is a delay between the gate voltage 210 of the IGBT device being driven low and the collector-emitter voltage (Vce) of the IGBT device increasing in response thereto (i.e. the IGBT turning off). The inventors have recognised that this delay, or 'state change reaction period (Δt)' of the IGBT device as hereafter referred to, may be used to modulate the control signal to the IGBT driver module to provide a second piece of information (e.g. to indicate a desired slew rate) to the IGBT driver before the collector-emitter voltage (Vce) of the IGBT device starts to change in response to It is proposed to use the presence or absence of at least one further transition within the control signal 310 during the state change reaction period (Δt) to convey at least one further piece of information to the IGBT driver module. Accordingly, in the example illustrated in FIG. 3, a second transition 314 of the control signal 310 is used to signal to the IGBT driver module that the IGBT device is to be turned off with, say, a slow slew rate. This information may be decoded by decoding logic, which in the illustrated example generates a slew rate control signal represented in the graph 300 by plot 330 comprising a transition 334 corresponding to the second transition 314 of the control signal 310. In the illustrated example, the control signal 310 comprises a third transition 316 to return the control signal 310 to the required state following the initial transition 312.

As described in greater detail below, the decoding logic may be arranged to differentiate between an initial modulation 312 of the control signal 310 representing a first piece of information and the presence/absence of a further modulation representing a further piece of information based on a time between modulations. For example, in the example illustrated in FIGS. 2 and 3, the state change reaction period (Δt) between the gate voltage 210 of the IGBT device being driven low and the collector-emitter voltage (Vce) of the IGBT device changes in response thereto is approximately 200 ns. Accordingly, in order for a further piece of information to be received by the IGBT driver module before the collector-emitter voltage (Vice) of the IGBT device changes in response to the first piece of information represented by an initial modulation of the control signal 310, such information must be received and decoded by the IGBT driver module within the state change reaction period (Δt), i.e. within 200 ns in the illustrated example, of the initial modulation of the control signal 310. Thus, upon receipt of an initial modulation within the control signal 310, decoding logic may be arranged to identify the next received modulation within the control signal 310 as representing a further piece of information if the next received modulation is received within, say, a period substantially equal to a defined state change reaction period (Δt) for the respective IGBT device.

Figure 4:
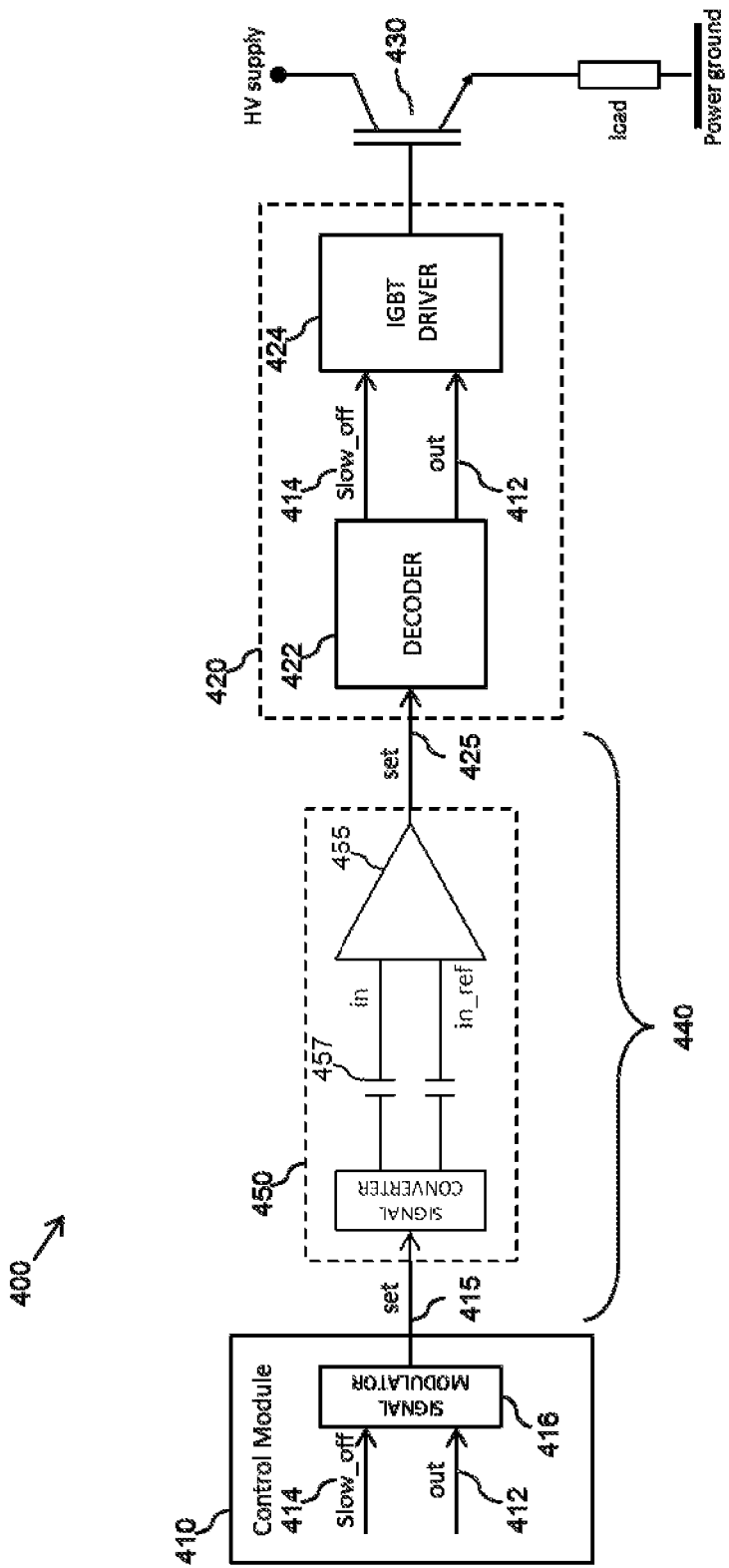
FIG. 4 illustrates a simplified circuit diagram of an example of an IGBT control apparatus.

Referring now to FIG. 4, there is illustrated a simplified circuit diagram of an example of an IGBT control apparatus 400. The IGBT control apparatus 400 comprises a control module 410 arranged to output IGBT control signals for controlling one or more IGBT devices. The IGBT control apparatus 400 further comprises an IGBT driver module 420 arranged to drive (e.g. turn on or off) an IGBT device 430 in accordance with received control signals. An output 415 of the IGBT control module 410 is operably coupled to an input 425 of the IGBT driver module 420 via a coupling channel 440, which in the illustrated example comprises an isolation circuit 450 arranged to provide electrical isolation between the IGBT control module 410 and the IGBT driver module 420, whilst conveying signals there between. In the illustrated example, the isolation circuit 450 comprises a capacitive isolation circuit. However, it will be appreciated that alternative types of isolation circuit may equally be implemented, for example such as an inductive isolation circuit, optical isolation circuit, etc.

Conventionally, such a coupling channel 440 is used to convey a single control signal between an IGBT control module and an IGBT driver module. As such, where more than one control signal is required to be conveyed from an IGBT control module to an IGBT driver module, for example such as within a dual slew rate implementation, more than one coupling channel (and thus more than one isolation circuit) is provided.

The IGBT control module 410 is arranged to receive a first IGBT control signal 412 indicating a required operating state of the IGBT device 430 and a further IGBT control signal 414, which in the illustrated example comprises a slew rate control signal. The IGBT control signals 412, 414 may be received from one or more external components (not shown) or generated internally within the control module 410. In the illustrated example, the IGBT control module 410 comprises a signal modulator component 416 arranged to modulate a logical state of the output 415 based at least partly on the control signals 412, 414. In particular, the signal modulator component 416 in the illustrated example is arranged to cause a first logical state modulation comprising a logical state transition at the output 415 of the IGBT control module 410 when the first IGBT control signal 412 indicates that an operating state of the IGBT device 430 is required to be changed (i.e. indicates that the IGBT device 430 is required to be turned on or turned off).

As described above, the output 415 of the IGBT control module 410 illustrated in FIG. 4 is operably coupled to the input 425 of the IGBT driver module 420, via the IGBT coupling channel 440. As such, a logical state transition at the output 415 of the IGBT control module 410 is conveyed via the coupling channel 440 to the input 425 of the IGBT driver module 420. In this manner, by causing a first logical state transition at the output 415 of the IGBT control module 410 when the first IGBT control signal 412 indicates that an operating state of the IGBT device 430 is required to be changed, the signal modulator component 416 is able to communicate the first control signal 412 to the IGBT driver module 420, and thereby to control the IGBT driver module 420 to change an operating state of the IGBT device 430 (as described in greater detail below).

The signal modulator component 416 is further arranged to apply further modulation to the logical state of the output 415 of the IGBT control module 410 in accordance with the second IGBT control signal 414. Specifically, the signal modulator component 416 is arranged to apply such further modulation within a time period from the first logical state modulation, the time period being less than a state change reaction period Δt for the at least one IGBT device.

As described above, the term "state change reaction period" as used herein refers to the delay between the time at which the gate voltage of the IGBT device 430 is driven from a first state (i.e. a high or low voltage state) to a second (opposing) state and the time at which the collector-emitter voltage (Vce) of the IGBT device 430 begins to change in response to the change in gate voltage. Such a delay is predominantly a result of the time taken for the IGBT gate to (dis)charge by a sufficient amount to affect the operating state of the IGBT device.

In this manner, by applying the further modulation to the logical state of the output 415 of the IGBT controller module 410 within this time period from the first logical state modulation, the second IGBT control signal 414 may be sequentially communicated to the IGBT driver module 420 in addition to the first control signal 412. Specifically, the second IGBT control signal 414 may be received by the IGBT driver module 420 before the collector-emitter voltage (Vce) of the IGBT device 430 begins to change in response to a change in gate voltage effected as a result of the first IGBT control signal 412 indicating a required change in operating state of the IGBT device 430, even if such a change in gate voltage is effected substantially immediately upon receipt of the IGBT control signal indication by the IGBT driver module 420. Thus, by applying the further modulation to the logical state of the output 415 of the IGBT controller module 410 within this time period from the first logical state modulation, at least one further control signal for controlling at least one further functionality of the IGBT driver module 420 may be communicated successively with an operating state change control signal to the IGBT driver module 420 via a single coupling channel 450, and be received by the IGBT driver module 420 before the collector-emitter voltage (Vce) of the IGBT device 430 begins to change in response to the operating state change signal (without having to delay implementing the change of operating state of the IGBT device 430). Such an ability may be particular beneficial when the further control signal relates to the change of operating state of the IGBT device, such as a slew rate control signal.

The IGBT driver module 420 comprises a decoder 422. The decoder 422 comprises an input, which in the illustrated example provides the input 425 of the IGBT driver module 420, arranged to be operably coupled to the output 415 of the IGBT control module 410. In the illustrated example, the input 425 of the decoder 422 is operably coupled to the output 415 of the IGBT control module 410 via the coupling channel 450.

The decoder 422 is arranged to detect a first logical state modulation at the input 425 thereof, and output a first IGBT control signal indicating a required change of operating state of the IGBT device 430 upon detection of such a first logical state modulation at the input 425 thereof. In this manner, when the first IGBT control signal 412 received by the IGBT control module 410 comprises an indication that an operating state of the IGBT device 430 is required to be changed, the signal modulator 416 causes a first logical state modulation at the output 415 of the IGBT control module 410. This first logical state modulation is conveyed via the coupling channel 450 to the input 425 of the decoder 422, which detects the first logical state modulation at the input 425 thereof and outputs a control signal indicating a required change of operating state of the IGBT device, thereby recreating the first IGBT control signal 412 received by the IGBT control module 410.

The decoder 422 is further arranged to detect at least one further modulation of the logical state at the input 425 thereof within a time period from the first logical state modulation, the time period being less than a state change reaction period Δt for the IGBT device 430, and to output at least one further IGBT control signal in accordance with the detected further modulation(s) of the logical state at the input 425 thereof. For example, in the illustrated example the decoder 422 is arranged to detect further modulation of the logical state at the input 425 thereof resulting from such modulation being applied to the output 415 of the IGBT control module 410 by the signal modulator 416 in response to the further IGBT control signal 414 received thereby; this further modulation being conveyed via the coupling channel 450 to the input 425 of the decoder 422. In this manner, the decoder 422 is able to recreate the further IGBT control signal 414 received by the IGBT control module 410.

The IGBT driver module 420 illustrate in FIG. 4 further comprises a driver component 424 arranged to receive the IGBT control signals 412, 414 output by the decoder 422, and to control the IGBT device 430 in accordance with the received IGBT control signals 412, 414. For example, the first IGBT control signal 412 may comprise an indication that the IGBT device 430 is required to be changed from a conductive operating state to a non-conductive operating state (i.e. turned off), and the second IGBT control signal 414 may comprise an indication of a slew rate with which the IGBT device is to be turned off (e.g. a fast or slow turn off rate). Thus, in this manner, the two control signals for controlling the IGBT driver module 420 to turn the IGBT device off with a particular slew rate are able to be conveyed from the IGBT control module 410 to the IGBT driver module 420 via a single coupling channel 450.

Figure 5:
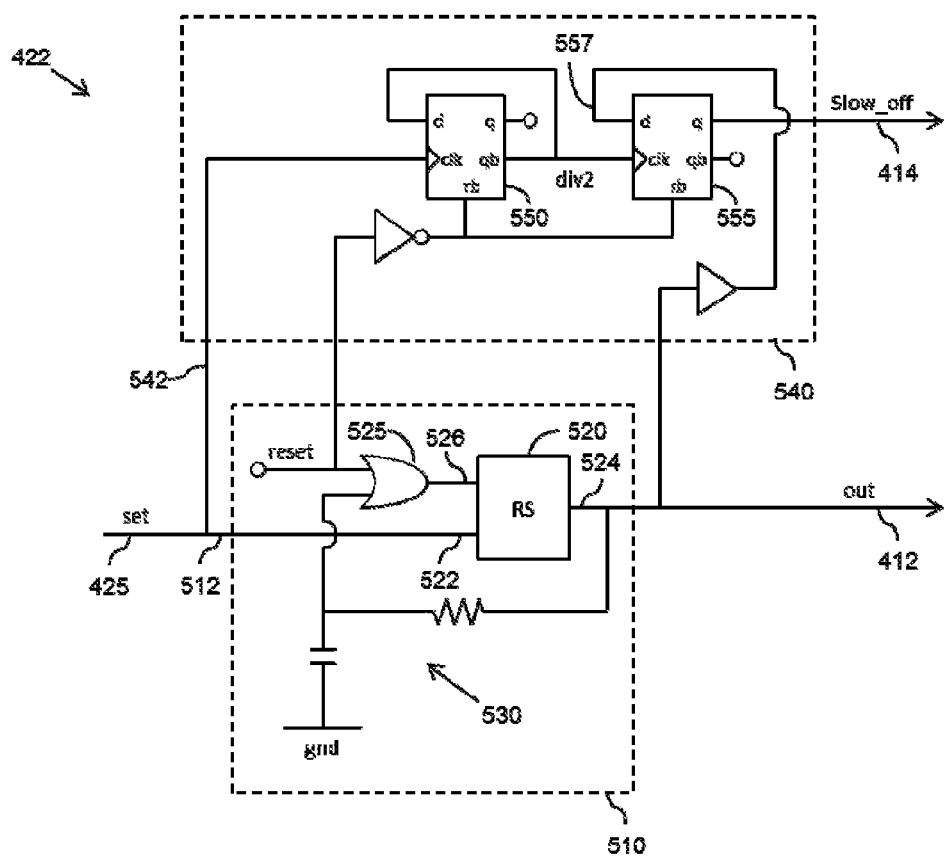
FIG. 5 illustrates a simplified block diagram of an example of at least a part of a decoder of an IGBT driver module.

Referring now to FIG. 5, there is illustrated a simplified block diagram of an example of at least a part of the decoder 422 of the IGBT driver module 420 of FIG. 4. In the illustrated example, the decoder 422 comprises a first decoding component 510. The first decoding component 510 comprises an input 512 operably coupled to the input 425 of the decoder 422, and thereby arranged to be operably coupled to the output 415 of, in the example of FIG. 4, the IGBT control module 410. The first decoding component 510 is arranged to detect a first logical state modulation at the input 512 thereof, and to output the first IGBT control signal 412 indicating a required change of operating state of the IGBT device 430 upon detection of such a first logical state modulation at the input 512 thereof.

In the illustrated example, the first decoding component 510 comprises an RS latch device 520 comprising a set input 522, which in the illustrated example provides the input 512 of the first decoding component 510 and thus arranged to be operably coupled to the output of the IGBT control module 410. In this manner, upon, say, a rising edge at the input 425 of the decoder 422 (i.e. a logical state transition from a low logical state to a high logical state) the RS latch device 520 'sets' an output 524 thereof, for example to a logical 'high' state. It will be appreciated that in alternative examples the RS latch device 520 may alternatively be arranged to set its output 524 upon a falling edge at the input 425 of the decoder 422 (i.e. a logical state transition from a high logical state to a low logical state) and/or to set its output 524 to a logical 'low' state. The output 524 of the RS latch device 520 is used to provide the first IGBT control signal 412 output by the decoder 422. Thus, the RS latch device 520 is arranged to 'detect' a logical state modulation at the input 425 of the decoder 422 comprising, in the above example, a rising edge, and to set its output in response thereto, thereby outputting the first IGBT control signal 412 indicating a required change of operating state of the IGBT device 430 upon detection of such a first logical state modulation at the input 425 of the decoder 422.

The RS latch device 520 further comprises a reset input 526 operably coupled (via an OR gate 525 in the illustrate example) to the output 524 of the RS latch device 520 via a delay circuit; the delay circuit in the illustrated example comprising an RC circuit indicated generally at 530. In this manner, the delay circuit 530 is arranged to delay the propagation of logical state transitions at the output 524 of the RS latch device 520 to the reset input 526 of the RS latch device 520.

This delayed reset feedback prevents the latch from resetting during the RC time constant. This provides a protection in case of a wrong input pulse due to, say, a high dV/dt generated by the first logical state modulation at the input 425 of the decoder 422. As such, in some examples the RC circuit may be arranged to comprise an RC time constant (and thus provide a delay) of greater than the state change reaction period $\Delta t$ for the IGBT device 230. Thus, where the state change reaction period $\Delta t$ for the IGBT device 230 comprises 200 ns, the RC circuit may be arranged to comprise an RC time constant of, say, 2 µs.

The decoder 422 further comprises a further decoding component 540 comprising an input 542 coupled to the input 425 of the decoder 422, and thus also arranged to be operably coupled to the output 415 of the IGBT control module 410. The further decoding component 540 is arranged to detect a modulation of the logical state at the input 542 other than a first logical state modulation within a time period from a first logical state modulation, the time period being less than a state change reaction period $\Delta t$ for the at least one IGBT device, and to output the second IGBT control signal 414 in accordance with the detected further modulation of the logical state at the input 542 thereof.

In the illustrated example, further decoding component 540 comprises a divide-by-two circuit comprising two sequentially coupled flip-flop devices 550, 555, a second of the flip-flop devices 555 arranged to be clocked upon each second pulse of the logic state at the input 542 of the further decoding component 540. A data input 557 of the second flip-flop device 555 is operably coupled to the output 524 of the first decoding component 510, and the second flip-flop device 555 is arranged to output, as the further IGBT control signal 414, the signal received at its data input 557 upon being clocked.

Figure 6:
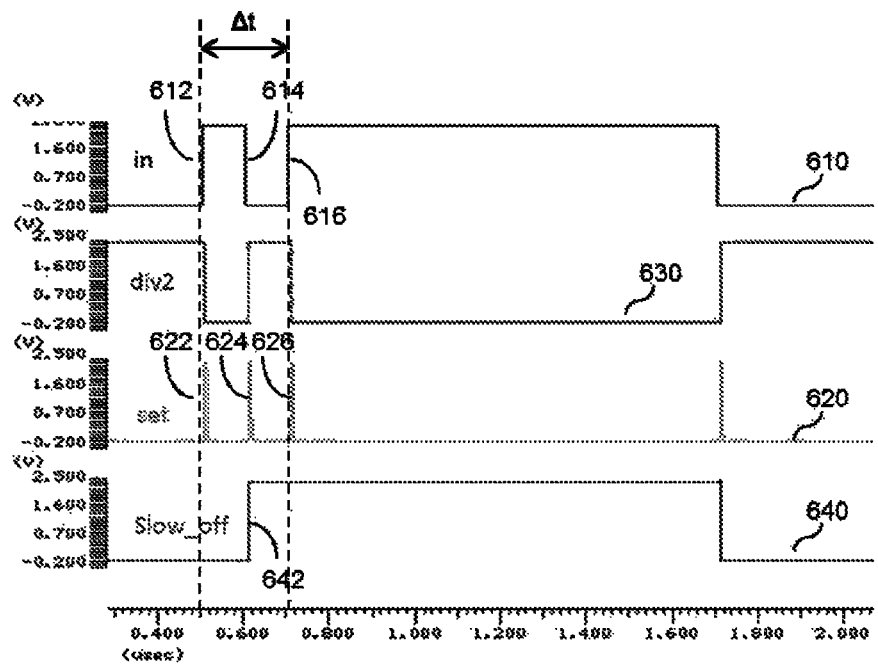
FIGS. 6 and 7 illustrate timing diagrams for signals within the decoder of FIG. 5.

The operation of the decoder will be described with reference FIGS. 6 and 7, which illustrate timing diagrams for signals within the decoder 422 illustrated in FIG. 5. Referring first to FIG. 6, there is illustrated a first set of timing diagrams. A first timing diagram 610 illustrates an example of a logical state 'in' at an input of the isolation circuit 450 of FIG. 4. The logical state at the input of the isolation circuit 450 represents the logical state at the output 415 of the IGBT control module 410. A second timing diagram 620 illustrates an example of a logical state 'set' at the input of the IGBT driver module 420 generated by a comparator 455 of the isolation circuit 450 in response to the logical state 'in' at the input of the isolation circuit 450 being conveyed across a capacitive coupling 457 of the isolation circuit 450. A third timing diagram 630 illustrates the clock signal 'div2' (output by the first flip-flop device 550) for the second flip-flop device 555 of the further decoding component 540 of the decoder 422. A fourth timing diagram 640 illustrates the as the further IGBT control signal 414 output by the second flip-flop device 555.

In the illustrated example, and as illustrated in FIG. 6, each logical state transition at an input of the isolation circuit 450 of FIG. 4, illustrated in the timing diagram 610, causes the comparator 455 of the isolation circuit 450 to generate a pulse at the input 425 of the IGBT driver module 420, illustrated in the timing diagram 620. In this manner, when the IGBT control module 410 applies a first logical state modulation to its output 415 comprising a first logical state transition, such as indicated at 612, that first logical state modulation is conveyed to the input 425 of the IGBT driver module 420 in the form of a pulse 622. Upon receipt of this first logical state modulation (pulse), the RS latch component 520 sets its output, for example 'high', thereby outputting the first IGBT control signal 412 indicating a required change of operating state of the IGBT device 430 (e.g. indicating that the IGBT device 430 is required to be turned off).

In the example illustrated in FIG. 6, the IGBT control module 410 applies a further logical state modulation to its output 415 within the time period Δt in accordance with the second IGBT control signal 414 comprising a further logical state transition, as indicated at 614. This logical state transition is also converted into a pulse 624 by the isolation circuit 450 that is received at the input 425 of the IGBT driver module 420. As illustrated in the timing graph 630, each pulse at the input 425 of the IGBT driver module 420 illustrated in the timing graph 620 is converted by the first flip-flop device 550 into a logical state transition of the clock signal 'div2' for the second flip-flop device 555. In this manner, the second pulse (logical state modulation) at the input 425 of the IGBT driver module 420 causes a rising edge in the clock signal 'div2' for the second flip-flop device 555, causing the second flip-flop device 555 to output the logical state at its data input 557; i.e. to output the high logical state output by the RS latch component 520, as indicated at 642, thereby outputting the second IGBT control signal 414 indicating, for example, that a slow slew rate for turning off the IGBT device 430 is required.

For completeness, the IGBT control module 410 applies a further logical state transition 616 to its output 415 such that the logical state of its output 415 is returned to the logical state following the first logical state transition 612. The logical state transition is also converted into a pulse 626 by the isolation circuit 450 that is received at the input 425 of the IGBT driver module 420, which also returns the logical state of the clock signal 'div2' for the second flip-flop device 555 to its logical state following the first logical state transition 612.

Figure 7:
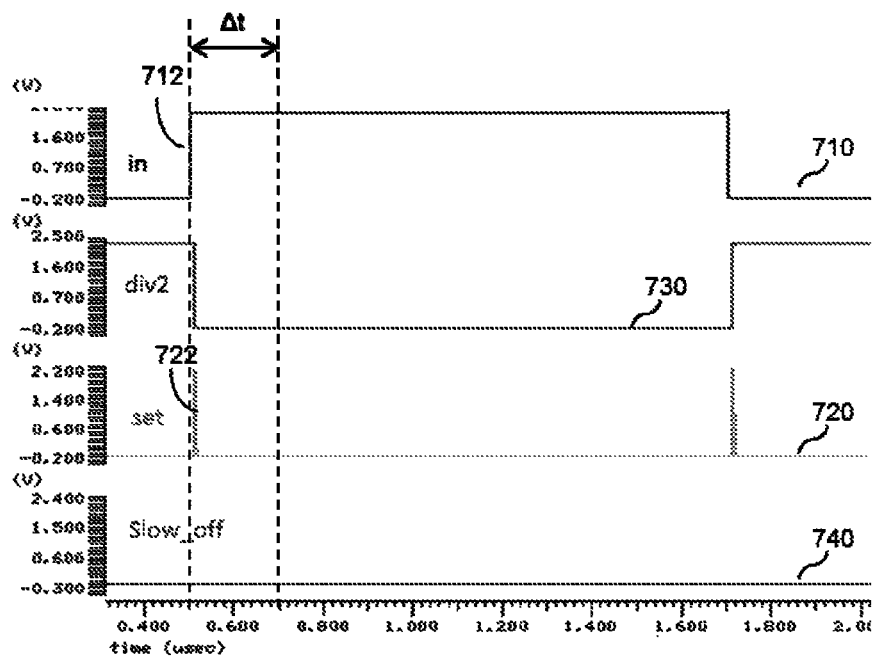

Referring now to FIG. 7, there is illustrated a second set of timing diagrams 710 to 740 corresponding to those of FIG. 6. Once again, the IGBT control module 410 applies a first logical state modulation to its output 415 comprising a first logical state transition, such as indicated at 712, that first logical state modulation is conveyed to the input 425 of the IGBT driver module 420 in the form of a pulse 722. Upon receipt of this first logical state modulation (pulse), the RS latch component 520 sets its output, for example 'high', thereby outputting the first IGBT control signal 412 indicating a required change of operating state of the IGBT device 430 (e.g. indicating that the IGBT device 430 is required to be turned off).

In the example illustrated in FIG. 7, the IGBT control module 410 applies a further logical state modulation to its output 415 in accordance with the second IGBT control signal 414 comprising a no further logical state transition within the time period Δt. In this manner, no further pulse is received at the input 425 of the IGBT driver module 420 within the time period Δt, and thus no rising edge is provided in the clock signal 'div2' for the second flip-flop device 555 within the time period Δt. As such, the second flip-flop device 555 maintains at its output the low logical state, thereby outputting the second IGBT control signal 414 indicating, for example, that a fast slew rate for turning off the IGBT device 430 is required.

Thus, in the examples illustrated in FIGS. 6 and 7, the IGBT control module 410 is arranged to apply the further modulation to the logical state at its output 415 in accordance with the second IGBT control signal 414 such that the further modulation comprises:

causing a further logical state transition 614 at the output 415 thereof within the time period Δt from the first logical state transition 612 in accordance with a first condition of the second IGBT control signal 414 (e.g. when the second IGBT control signal 414 indicates that, say, a slow turn-off slew rate for the IGBT device 430 is required); and causing no further logical state transition at the output 415 thereof within the time period Δt from the first logical state transition 712 in accordance with a second condition of the second IGBT control signal 414 (e.g. when the second IGBT control signal 414 indicates that, say, a fast turn-off slew rate for the IGBT device 430 is required).

Similarly, in the examples illustrated in FIGS. 6 and 7, the IGBT driver module 420 is arranged to detect the further modulation to the logical state at its input 425 comprising:

a second pulse 624 at the input thereof within the time period Δt from a first pulse 622, in accordance with a first condition of the second IGBT control signal 414 (e.g. when the second IGBT control signal 414 indicates that, say, a slow turn-off slew rate for the IGBT device 430 is required); and no further pulse at the input thereof within the time period Δt from a first pulse 722, in accordance with a second condition of the second IGBT control signal 414 (e.g. when the second IGBT control signal 414 indicates that, say, a fast turn-off slew rate for the IGBT device 430 is required).

Figure 8:
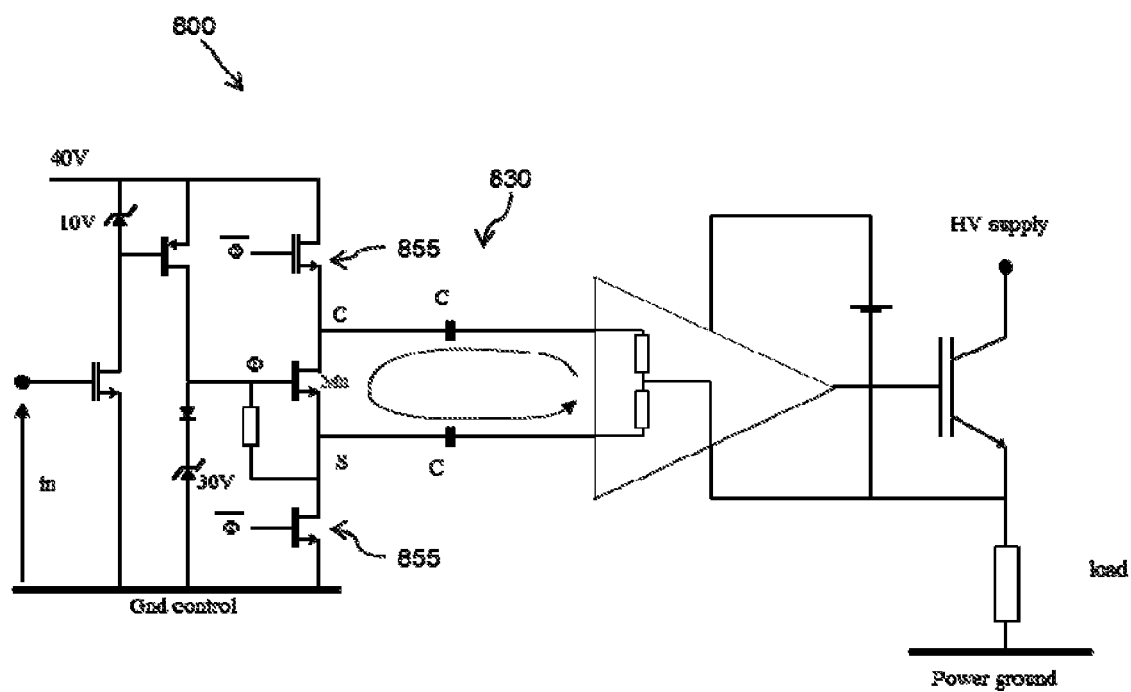
FIG. 8 illustrates a simplified circuit diagram of an alternative example of an isolation circuit.

Referring back to FIG. 3, in order to enable the further modulation comprising the additional logical state transitions to be conveyed via the isolation circuit 450, and in particular to be conveyed via the capacitive coupling 457 of the isolation circuit 450, within the state change reaction period Δt for the IGBT device 430, a very narrow pulse width is required to be implemented between the first logical state transition 312 and the second logical state transition 314, for example between 20 and 40 ns. In the example of an isolation circuit 100 illustrated in FIG. 1, resistors 155 are used to passively pull up/down the input terminals of the capacitive coupling 130. A problem with such a passive arrangement for driving the capacitive coupling 130 is that it results in a relatively low dV/dt for the input of the capacitive coupling, making it difficult to achieve the required narrow pulse width between logical state transitions. Accordingly, and referring to FIG. 8, in some examples of the present invention there is provided an isolation circuit 800 in which the resistors 155 of FIG. 1 are replaced by active switching devices, illustrated as transistors 855 in FIG. 8 to actively pull up/down the input terminals of the capacitive coupling 830. This active pull up/down arranged enables both positive and negative fast dV/dt to be achieved, thereby enabling a sufficiently narrow pulse width of, say, between 20 and 40 ns to be implemented.

Figure 9:
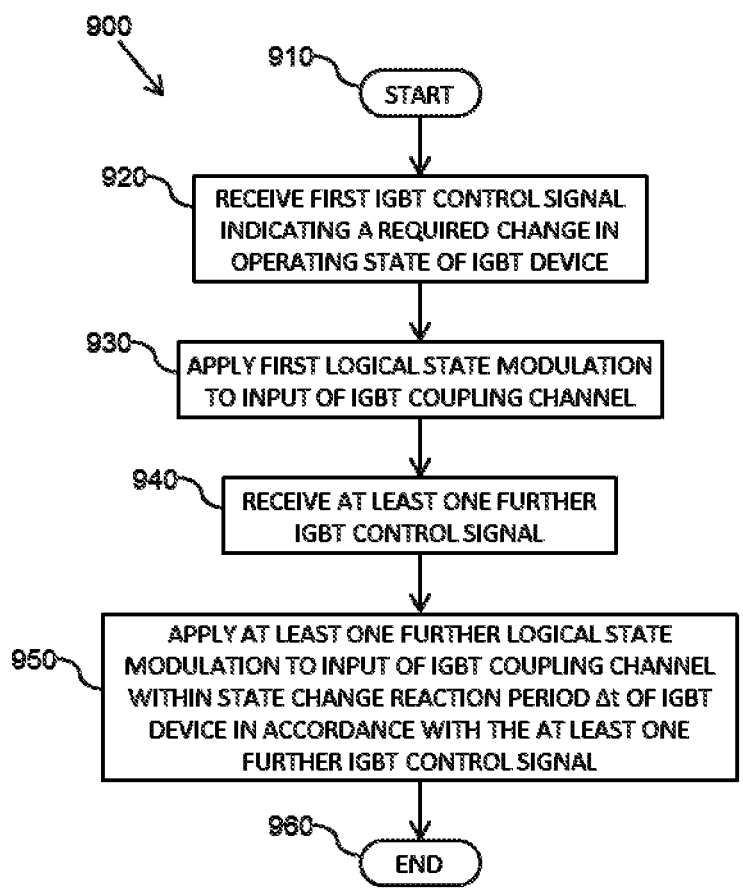
FIGS. 9 and 10 illustrate simplified flowcharts of an example of a method of controlling an IGBT device.
Figure 10:
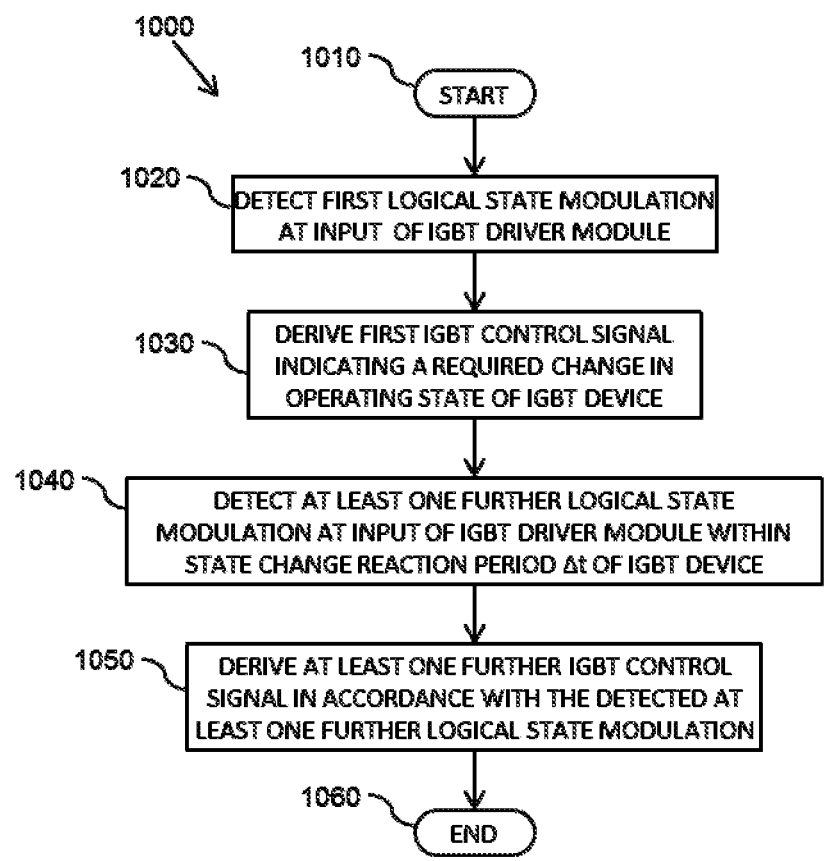

Referring now to FIGS. 9 and 10, there are illustrated simplified flowcharts 900, 1000 of an example of a method of controlling an IGBT device, such as may be implemented within the IGBT control apparatus illustrated in FIG. 4. Referring first to FIG. 9, a first part of the method is illustrated such as may be implemented within the IGBT control module 410 of FIG. 4. The method starts at 910, and moves on to 920 where a first IGBT control signal indicating a required change in operating state of an IGBT device is received, such as the IGBT control signal 412 of FIG. 4. Upon receipt of the first IGBT control signal indicating that a change in operating state is required for the IGBT device, a first logical state modulation is applied to an input of an IGBT coupling channel between the IGBT control module and an IGBT driver module for the IGBT device, at 930. For example, such a first logical state modulation may comprise causing a logical state transition as described above. At least one further IGBT control signal is also received at 940, such as the further IGBT control signal 414 of FIG. 4. At least one further logical state modulation is also applied to the input of the IGBT coupling channel between the IGBT control module and the IGBT driver module for the IGBT device in accordance with the at least one further IGBT control signal, at 950. In particular, the at least one further logical state modulation is applied to the input of the IGBT coupling channel within a state change reaction period Δt for the IGBT device from the first logical state modulation applied at 930. Such a further logical state modulation may comprising the causing or not, in accordance with the further IGBT control signal, of at least one further logical state transition to the input of the IGBT coupling channel. The method then ends at 960.

Referring next to FIG. 10, a second part of the method is illustrated such as may be implemented within the IGBT driver module 420 of FIG. 4. The method starts at 1010, and moves on to 1020 with the detection a first logical state modulation at an input of the IGBT driver module. Such a first logical state modulation may comprise a first pulse, such as described above. Next, at 1030, a first IGBT control signal indicating a required change of operating state of at least one IGBT device is derived in response to the detection of the first logical state modulation. The method then moves on to 1040 where at least one further logical state modulation is detected at the input of the IGBT driver module within a state change reaction period Δt for the IGBT device from the first logical state modulation detected at 1020. Such a further logical state modulation may comprise, for example, the presence or not of one or more further pulses. Next, at 1050, at least one further IGBT control signal is derived in accordance with the detected at least one further logical state modulation at the input of the IGBT driver module. The method then ends, at 1060.

Thus examples of a method and apparatus for controlling an IGBT device have been described that enable, for example, a dual slew rate to be implemented when the IGBT device is switched on/off via a single IGBT coupling channel between an IGBT control module and an IGBT driver module therefor.

Examples of the present invention has been described with reference to an IGBT control apparatus comprising a low voltage control module operably coupled to a high voltage driver module via an isolation circuit for providing electrical isolation between the control module and the driver module. However, it is contemplated that the present invention may equally be implemented within alternative IGBT control apparatus arrangements. For example, although the present invention provides specific benefits to reducing the number of isolation circuits required to be provided between a control module and a driver module, the present invention is not restricted to use within an IGBT control apparatus requiring electrical isolation between a control module and a driver module.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the decoder 422 and driver component 424 of the IGBT driver module 420 have been illustrated as separate functional components. However their respective functionalities may equally be implanted within a single functional block.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the IGBT control module 410, components of the isolation circuit 450 and the IGBT driver module 420 may each be implemented within individual integrated circuit devices. Alternatively, the examples may be implemented as any number of separate integrated circuits or separate devices interconnected with each other in a suitable manner. For example, in some examples components of the isolation circuit 450 either side of the coupling component(s) 457 may be implemented within the respective integrated circuit devices of the IGBT control module 410 and the IGBT driver module 420.

Also, the invention is not limited to physical devices or units implemented in non-programmable hardware but can also be applied, at least in part, in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A control module for controlling at least one insulated gate bipolar transistor, IGBT, device; the control module comprising at least one output arranged to be operably coupled to at least one IGBT driver module for the at least one IGBT device;
the control module is arranged to receive a first IGBT control signal indicating a required operating state of the at least one IGBT device and at least one further IGBT control signal;
wherein the control module is further arranged to, upon the first IGBT control signal indicating a required change in operating state of the at least one IGBT device:
control the at least one IGBT driver module to change an operating state of the at least one IGBT device by applying a first logical state modulation at the output thereof; and
apply at least one further modulation to the logical state at the output thereof in accordance with the at least one further IGBT control signal within a time period from the first logical state transition, the time period being less than a state change reaction period Δt for the at least one IGBT device.

2. The control module of claim 1, wherein the first logical state modulation comprises a logical state transition at the output of the control module.

3. The control module of claim 1, wherein applying the at least one further modulation to the logical state at the output of the control module comprises:
causing at least one logical state transition at the output of the control module within the time period from the first logical state modulation, in accordance with a first condition of the at least one further IGBT control signal; and
causing no further logical state transitions at the output of the control module within the time period from the first logical state modulation, in accordance with a second condition of the at least one further IGBT control signal.

4. The control module of claim 3, wherein applying the at least one further modulation to the logical state at the output of the control module further comprises, in accordance with the first condition of the at least one further IGBT control signal, causing at least one still further logical state transition at the output thereof such that the logical state of the output of the control module is returned to the logical state following the first logical state modulation.

5. The control module of claim 1, wherein the at least one further IGBT control signal comprises an IGBT operating state change slew rate control signal.

6. A method of controlling an insulated gate bipolar transistor, IGBT, device, the method comprising receiving a first IGBT control signal indicating a required operating state of the IGBT device and receiving at least one further IGBT control signal; wherein the method further comprises, upon the first IGBT control signal indicating a required change in operating state of the IGBT device:
controlling an IGBT driver module for the IGBT device to change an operating state of the IGBT device by applying a first logical state modulation at an input of an IGBT coupling channel; and
applying at least one further modulation to the logical state at the input of the IGBT coupling channel in accordance with the at least one further IGBT control signal within a time period from the first logical state modulation, the time period being less than a state change reaction period Δt for the at least one IGBT device.

7. An insulated gate bipolar transistor, IGBT, driver module comprising at least one decoder; the at least one decoder comprising an input arranged to be operably coupled to an output of at least one IGBT control module and arranged to:
detect a first logical state modulation at the input thereof, and output a first IGBT control signal indicating a required change of operating state of at least one IGBT device upon detection of a first logical state modulation at the input thereof; and
detect at least one further modulation of the logical state at the input thereof within a time period from the first logical state modulation, the time period being less than a state change reaction period Δt for the at least one IGBT device, and output at least one further IGBT control signal in accordance with the detected at least one further modulation of the logical state at the input thereof.

8. The IGBT driver module of claim 7, wherein the at least one decoder is arranged to detect logical state modulations at the input thereof comprising logical state pulses.

9. The IGBT driver module of claim wherein the at least one decoder is arranged to detect at least one further modulation of the logical state at the input thereof comprising:
- at least one pulse at the input thereof within the time period from the first logical state modulation, in accordance with a first condition of the at least one further IGBT control signal; and
- no further logical state modulations at the input thereof within the time period from the first logical state transition, in accordance with a second condition of the at least one further IGBT control signal.

10. The IGBT driver module of claim 7, wherein the at least one decoder comprises a first decoding component comprising an input arranged to be operably coupled to an output of at least one IGBT control module, the first decoding component being arranged to detect a first logical state modulation at the input thereof, and output a first IGBT control signal indicating a required change of operating state of at least one IGBT device upon detection of a first logical state modulation at the input thereof.

11. The IGBT driver module of claim 10, wherein the first decoding component comprises an RS latch device comprising a set input arranged to be operably coupled to an output of at least one IGBT control module.

12. The IGBT driver module of claim 11, wherein the RS latch device further comprises a reset input operably coupled to an output of the RS latch device via a delay circuit.

13. The IGBT driver module of claim 7, wherein the decoder comprises at least one further decoding component comprising an input arranged to be operably coupled to an output of at least one IGBT control module, the at least one further decoding component being arranged to detect at least one further modulation of the logical state at the input thereof within a time period from the first logical state modulation, the time period being less than a state change reaction period Δt for the at least one IGBT device, and output at least one further IGBT control signal in accordance with the detected at least one further modulation of the logical state at the input thereof.

14. The IGBT driver module of claim 13, wherein the at least one further decoding component comprises a divide-by-two circuit comprising at least one flip-flop device arranged to be clocked upon each second pulse of a logical state at the input of the at least one further decoding component; wherein a data input of the at least one flip-flop device is operably coupled to the output of the first decoding component, and the at least one flip-flop device is arranged to output, as at least one further IGBT control signal, the signal received at its data input upon being clocked.

15. An IGBT driver module of claim 7, wherein the IGBT driver module further comprises at least one driver component arranged to receive the first and at least one further IGBT control signals output by the at least one decoder, and to control at least one IGBT device in accordance with the received first and at least one further IGBT control signals.

16. The IGBT driver module of to claim 15, wherein the at least one driver component is arranged to control a change of operating state of the IGBT device in accordance with the first IGBT control signal.

17. The IGBT driver module of to claim 15, wherein the driver component is arranged to control a slew rate with which an operating state of the IGBT device is to be changed in accordance with the at least one further IGBT control signal.

18. A method of controlling an insulated gate bipolar transistor, IGBT, device, the method comprising, within an IGBT driver module:
- detecting a first logical state modulation at an input of the IGBT driver module;
- deriving a first IGBT control signal indicating a required change of operating state of at least one IGBT device upon detection of a first logical state modulation at the input thereof;
- detecting at least one further modulation of the logical state at the input of the IGBT driver module within a time period from the first logical state modulation, the time period being less than a state change reaction period Δt for the at least one IGBT device; and
- deriving at least one further IGBT control signal in accordance with the detected at least one further modulation of the logical state at the input thereof.

19. An insulated gate bipolar transistor, IGBT, control apparatus comprising at least one IGBT driver module according to claim 7.

* * * * *